(12) United States Patent
Espiau De Lamaestre et al.

(10) Patent No.: US 8,618,622 B2
(45) Date of Patent: Dec. 31, 2013

(54) PHOTODETECTOR OPTIMIZED BY METAL TEXTURING PROVIDED ON THE REAR SURFACE

(75) Inventors: Roch Espiau De Lamaestre, Grenoble (FR); Salim Boutami, Grenoble (FR); Olivier Gravrand, Fontanil Cornillon (FR); Jérôme Le Perchec, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 140 days.

(21) Appl. No.: 13/324,315

(22) Filed: Dec. 13, 2011

(65) Prior Publication Data

US 2012/0181645 A1    Jul. 19, 2012

(30) Foreign Application Priority Data

Jan. 17, 2011    (FR) .................... 11 50351

(51) Int. Cl.
*H01L 27/14* (2006.01)
*H01L 31/00* (2006.01)

(52) U.S. Cl.
USPC ............... 257/431; 257/436; 257/E33.076; 257/E31.121

(58) Field of Classification Search
USPC ............ 257/21, 431, 436, 460, E33.076, 257/E31.121
See application file for complete search history.

(56) References Cited

U.S. PATENT DOCUMENTS 6,423,980 B1    7/2002    Wilson et al.
6,465,803 B1 *  10/2002   Bowers et al. ............. 257/21

FOREIGN PATENT DOCUMENTS

EP    0 807 982 A1    11/1997
WO    2005/081782 A2    9/2005

OTHER PUBLICATIONS

G. Sarusi, et al., "*Improved Performance of Quantum Well Infrared Photodetectors Using Random Scattering Optical Coupling*," Applied Physics Letters, vol. 64, No. 8, Feb. 21, 1994, pp. 960-962.
Gunapala et al., "*Metal Side Reflectors for Trapping Light in QWIPs*," NASA Tech Briefs, vol. 30507, Jun. 1, 2003, pp. 1-2.
Bandara et al., "*Tridirectional Gratings as Improved Couplers for QWIPs*," NASA Tech Briefs, vol. 20703, May 1, 2000, pp. 1-3.
C. Haase et al., "*Optical Properties of Thin-Film Silicon Solar Cells with Grating Couplers*," Progress in Photovoltaics: Research and Applications, Prog. Photovolt: Res. Appl. 2006; vol. 14, No. pp. 629-641.

* cited by examiner

*Primary Examiner* — Hoai V Pham
(74) *Attorney, Agent, or Firm* — Burr & Brown, PLLC

(57) ABSTRACT

Backlit detector for the detection of electromagnetic radiation around a predetermined wavelength, including a semiconductor absorption layer, formed above a transparent medium, capable of transmitting at least some of said radiation, and a mirror above the semiconductor layer, and placed between the mirror and the semiconductor layer, a periodic grating of metallic patterns, the mirror and the grating being included in a layer of material transparent to said radiation and formed on the semiconductor layer.

23 Claims, 6 Drawing Sheets

PHOTODETECTOR OPTIMIZED BY METAL TEXTURING PROVIDED ON THE REAR SURFACE

BACKGROUND OF THE INVENTION

1. Field of the Invention

This invention relates to the field of high-quantum efficiency detectors, and is of particular use in the field of detectors with a thin absorption layer.

2. Description of Related Art

As is known per se, a photodetector comprises a semiconductor layer capable of absorbing photons in order to convert them into electron hole pairs which are collected to generate an electric current.

The quantum efficiency of a photodetector, which is defined as the ratio between the number of photons received by the photodetector and the number of photons absorbed thereby, is therefore the principal characteristic determining the quality of the photodetector. Since said efficiency is related to the absorption capacity of the semiconductor layer, it is easily understood that a large volume of semiconductor material allows high levels of efficiency to be attained.

However, a semiconductor layer of reduced volume also offers a certain number of advantages. Photodetectors with a semiconductor layer of reduced volume thus offer a reduced material cost, are faster, or have an improved signal-to-noise ratio as regards generation-recombination noise.

However, the drop in quantum efficiency caused by reducing the absorption volume is also accompanied by other disadvantages.

In particular, as the thickness of the semiconductor absorption layer diminishes, it lets more and more photons through without absorbing them, and therefore becomes increasingly "transparent" to the radiation for detection.

To enhance light absorption in thin semiconductor layers deposited on growth substrates, solutions are thus usually considered for placement on the rear surface of the semiconductor layer, i.e., the surface opposite the one receiving the incident radiation, so that at least some of the radiation that has passed through the semiconductor layer without being absorbed can be "recovered".

A first solution comprises placing a plane reflector, for example a metal mirror or a Bragg mirror, on the rear surface of the semiconductor layer so as to reflect the non-absorbed light back towards it. This solution enhances absorption by sending the light through the semiconductor layer twice without particular resonance. This solution may however prove inadequate in the case of layers that are very thin or too unabsorbent, in other words if the double-thickness passed through still does not allow full absorption.

In the situation where the plane mirror does not suffice, another solution comprises using a textured rear reflector, which serves to optimize quantum efficiency enhancement by directing the radiation more along the absorption layer. Indeed, texturing allows the radiation for detection to be coupled with a trapped mode of the semiconductor layer. This solution is clearly more effective than using a straightforward plane mirror. Furthermore, it uses a diffraction phenomenon through a grating which makes the detection sensitive to the wavelength of the incident light via the grating period. This applies for example to solar cells, as shown in the reference work "*Optical Properties of Thin-film Silicon Solar Cells with Grating Couplers*" by C. Haase and H. Stiebig, Progress in photovoltaics: research and applications, vol. 14, p 629-641 (2006), with a one-dimensional diffraction grating of the type with silver grooves, having a typical thickness of $\lambda/4n_{Si}$.

As such, it is remarkable to note that texturing serves to a certain extent to transform the disadvantage of the "transparency" of the semiconductor absorption layer into an advantage. Thus, since the quantum efficiency gain obtained by coupling to the trapped mode of the semiconductor layer is by no means insignificant, the thickness of the semiconductor layer is intentionally selected as "thin" in order to let some of the radiation through so that significant coupling can be obtained through the texturing.

"Thin" semiconductor layer is taken in terms of the invention to mean a semiconductor layer whereof the thickness is selected in such a way that some of the radiation of interest passes through said layer without being absorbed. For example, a semiconductor layer whereof the thickness t verifies $$t \leq \frac{\lambda}{3 \times \text{Im}(n_1)},$$

where $\lambda$ is the wavelength for detection, $n_1$ is the refractive index of the semiconductor layer and Im in denotes the imaginary component, is considered as thin in terms of the invention since it lets through the wavelength for detection. This equates in particular to a thickness t of less than one micrometer in the infrared spectrum.

Furthermore, as may be observed, the structuring thickness depends on the wavelength for detection. Thus when this type of structuring is used in the infrared, it is necessary to implement structures of substantial thickness. In fact, it is difficult to structure such thicknesses in a metal material given, for example, cap lift-off problems, problems of filling deep cavities, problems of controlling the depth of a deep etch in a dielectric when the thickness between the bottom of the cavity and the absorbent semiconductor layer needs to be accurately controlled, problems of etching noble metals such as gold which require high-temperature plasma-based methods, and typically temperatures above 200° C. For example, the document WO2005/081782 discloses a detector that combines a textured rear reflector with a semiconductor absorption layer. In this document, it is proposed to use a waffle-type coupling grating, placed to the rear of an absorption layer formed from a stack of quantum wells so as to increase absorption in a range of infrared radiation. The purpose of the periodic grating with square holes is in this case to reflect the radiation passing through the absorption layer without being absorbed while dispersing it therein. Enhanced quantum efficiency is observed, but this enhancement is obtained by combining the quantum wells and the reflector and additionally requires the reflector to be structured with a thickness of about one quarter of the wavelength, which is highly significant when working in the infrared spectrum.

It can be seen as a result that for textured rear reflectors of the prior art, the structuring thickness is strongly coupled to the wavelength for detection, which offers a certain number of disadvantages, particularly in the infrared spectrum.

SUMMARY OF THE INVENTION

The purpose of the invention is to resolve the aforementioned problem of strong coupling between the structuring thickness of a reflector and the wavelength for detection by proposing a texturing-based architecture whereof the thickness is no longer dependent on said wavelength.

To this end, the object of the invention is a backlit detector for the detection of electromagnetic radiation around a predetermined wavelength, including:

a semiconductor absorption layer for the absorption of said radiation, formed above a medium at least partially transparent to said radiation, and having a thickness capable of transmitting at least some of said radiation; and a mirror placed above the semiconductor layer to reflect radiation received therethrough.

According to the invention, the detector comprises, placed between the mirror and the semiconductor layer, a periodic grating of metallic patterns, the mirror and the periodic grating being included in a layer of material at least partially transparent to said radiation and formed on the semiconductor layer.

The mirror and the periodic grating of metallic patterns are further designed so as to verify the following relations:

$$d \le \frac{\lambda}{\text{Re}(n_1)}$$

$$\frac{\lambda}{16 \times \text{Re}(n_2)} + m \times \frac{\lambda}{2 \times \text{Re}(n_2)} \le h \le \frac{3 \times \lambda}{8 \times \text{Re}(n_2)} + m \times \frac{\lambda}{2 \times \text{Re}(n_2)}$$

$$\text{Re}(n_2) \le 1, 3 \times \text{Re}(n_1)$$

$$\text{Re}(n_1) \ge \text{Re}(n_{substrat})$$

where:

Re denotes the real component;

d is the distance between the semiconductor layer (14) and the periodic grating (18), h is the distance between the mirror and the periodic grating, m is a positive or null integer, λ is a wavelength at which the semiconductor layer is absorbent, $n_1$ is the refractive index of the semiconductor layer, $n_2$ is the refractive index of the layer in which the periodic grating and the mirror are formed, and $n_{substrat}$ is the refractive index of the medium above which the semiconductor absorption layer is formed.

Put another way, the invention comprises a particular combination of a mirror and a diffraction grating which produces a resonant diffraction of the radiation in the absorption layer. In particular, evanescent diffracted orders store energy in the vicinity of the grating and may be absorbed by the neighboring absorption layer, without the latter being in direct contact with the grating. These orders may become propagative again when they enter the absorption layer. Some of the energy is also absorbed by the metal, but this is still a small amount, particularly when a noble metal, such as gold, silver or aluminum is chosen for a grating. The mirror for its part reflects the part of the flux diffracted in the direction of the incident radiation towards the absorption layer.

In particular, it is possible via the invention to obtain about 80% quantum efficiency, and to do so even in thin layer detectors with a grating 50 nm thick for a wavelength of 4 μm. More generally, the invention makes it possible to implement a periodic grating of thin metallic patterns with a typical thickness of less than 100 nm irrespective of the wavelength in the infrared spectrum. Comparatively to the prior art which requires, at best, a thickness of 500 nm at this same wavelength, i.e., a gain of a factor of 5, or even of 10, in respect of the thickness for structuring.

Thus, apart from specifically achieving very high-quantum efficiency, the invention makes it possible in a general way to enjoy the advantages of a structuring design without the thickness thereof being strongly coupled to the wavelength of the radiation for detection.

It is furthermore important to note that the invention does not transfer the difficulty of manufacturing metal structures of substantial thickness onto other characteristics, for example the distance between the grating and the semiconductor layer.

Indeed, the invention allows the use of planar technology, which is straightforward given the thinness of the grating. The inventive structure is therefore easy to manufacture, according to a "lift-off" technique for example, without using too substantial a thickness of resin, or by etching without having to etch thicknesses of the order of magnitude of the wavelength to which the absorption layer is set. Additionally, the manufacture of the mirror requires no planarization step, since its design is tolerant to the structuring transferred when depositing the space layer. The mirror behaves moreover in the same manner optically, whether it is perfectly plane, or nano-structured.

Apart from the possibility afforded of having a structuring design whereof the thickness no longer depends on the wavelength for detection, the invention has other substantial advantages, among which may be cited:

enhanced quantum efficiency both for TM polarization and TE polarization, even with a one-dimensional grating, when $$\frac{1}{5} \le f \le \frac{3}{4}$$

where f is the grating fill factor. The invention requires no bi-periodization of the grating in order to operate in both polarizations;

sturdiness against geometric variations, particularly as regards the grating fill factor, in the distance separating the absorption layer from the grating, or in the distance separating the grating from the mirror. The simplified manufacture of matrices of pixels sensitive to different wavelengths (multi-spectral detection) is thus conceivable;

it is not necessary to structure the semiconductor layer; and the use of this structure also makes it possible to adjust the resonance i.e., absorption enhancement) wavelength via a lateral dimension of the grating (in this case mainly the grating pitch) and not by the thickness of the layers, which makes conceivable the facilitated formation of matrices of pixels sensitive to different wavelengths (multispectral detection).

Thus, the structure according to the invention makes it possible to work, with no loss of quantum efficiency, with smaller active volumes than in the prior art, and therefore to obtain slighter dark-noises or to work at a less low temperature, or to operate the detector at a higher frequency than usual. It also makes it possible to fulfill a spectral or polarization filtering function by lateral structuring of the metal layer, in the case of pixellized detectors.

This structure is also compatible with the standard manufacturing method for the technological production of detectors made of $Hg_{1-x}Cd_xTe$ (Mercury Cadmium Telluride, abbreviated to MCT) designed for the detection of near to very far infrared radiation, according to the fraction x of cadmium, and has the advantage of involving only thin metal structuring designs, unlike prior art solutions which are based on metal structures of substantial thickness, difficult to apply to infrared radiation, especially when it is far infrared radiation.

In a preferred use of the invention, the semiconductor layer has a thickness of less than 500 nanometers, and preferably more than 50 nanometers. Put another way, a substantial enhancement of quantum efficiency is even obtained for thin to very thin absorption layers.

According to one embodiment of the invention, the periodic grating of metallic patterns is designed to verify the following relation:

$$\frac{\lambda}{\text{Re}(n_1)} \leq p \leq \frac{\lambda}{\max(\text{Re}(n_2), \text{Re}(n_{substrat}))}$$

where p is the grating pitch.

As explained above, the effect of the previous relations bearing on the distance d, the height h and the indices $n_1$, $n_2$ and $n_{substrat}$ is enhanced quantum efficiency via a resonant diffraction phenomenon. However, given the complexity of the electromagnetic phenomena involved, there is sometimes no guarantee that the resonance peak is at the length $\lambda$. The effect of the relation bearing on the period p is to set the peak of the resonance phenomenon diffracting substantially to the wavelength $\lambda$. It is remarkable to note that the inventive structure has a real degree of freedom to fix the position of the resonance diffracting in the range of wavelengths absorbed by the semiconductor absorption layer.

According to a particular embodiment, the semiconductor layer has a thickness of less than 500 nanometers, and preferably more than 50 nanometers.

According to one inventive embodiment, the thickness t of the semiconductor layer verifies the relation $$t \leq \frac{\lambda}{3 \times \text{Im}(n_1)}.$$

This guarantees that the radiation is not totally absorbed by the semiconductor layer when it first passes through and that it therefore sees the influence of the grating.

According to one embodiment of the invention, the distance between the mirror and the periodic grating is substantially equal to $$\frac{\lambda}{4 \times \text{Re}(n_2)}$$

or an odd multiple of this value. In this way, constructive interference of the radiation in the absorption layer is promoted, which furthers enhances quantum efficiency.

According to an alternative embodiment of the invention, the periodic grating is one-dimensional, and is in particular constituted by metal bars. To advantage, the fill factor f of the periodic grating verifies the relation $$\frac{1}{5} \leq f \leq \frac{3}{4}.$$

According to another alternative embodiment of the invention, the grating is two-dimensional, and is in particular constituted by holes or pads. Put another way, the invention produces its quantum efficiency enhancement effect in an identical manner in TM polarization and in TE polarization for invariant geometries by 90° rotation (e.g., round or square hole gratings with a square mesh), or in a greatly different way in both polarizations for invariant geometries by 90° rotation (e.g., round or square hole grating with a rectangular mesh, or rectangular hole grating with a square mesh, etc.). In other words, the use of the two-dimensional grating allows an increased control of the polarization response.

According to an alternative embodiment of the invention, the mirror is metal, and one surface of the mirror facing the periodic grating is textured. In particular, the mirror is textured over a thickness e verifying the relation $$e \leq \frac{\lambda}{10 \times \text{Re}(n_2)}.$$

More specifically, the periodic grating and/or the mirror are made of a metal with low optical loss, and in particular silver, gold, copper or aluminum, which makes it possible to minimize the energy absorbed by the metal constituting the grating and mirror.

According to another alternative of the invention, the mirror is a Bragg minor which has the advantage of not absorbing radiation. In particular, the Bragg minor includes at least one quarter wave bi-layer, constituted for example by a layer of germanium with a thickness of $$\frac{\lambda}{4 \times \text{Re}(n_{Ge})}$$

and a layer of zinc sulfide with a thickness of $$\frac{\lambda}{4 \times \text{Re}(n_{ZnS})},$$

where $n_{Ge}$ and $n_{ZnS}$ are the refractive indices of the germanium and the zinc sulfide respectively.

According to one embodiment of the invention, the radiation for detection is an infrared radiation, and the thickness of the periodic grating is less than or equal to 100 nm.

According to an embodiment of the invention, the semiconductor absorption layer is constituted by a semiconductor material selected from the group comprising CdHgTe, InGaAs and III-V ternary semiconductors including Sb, InSb, SiGe or Ge.

According to one embodiment of the invention, the distance d between the periodic grating and the absorbent semiconductor layer is nil, the grating lying therefore on the semiconductor layer. This allows the electrical collection of the photo-charge carriers generated by means of the grating itself which then serves as a collector electrode. The advantage afforded by this configuration is the increased speed of the photodetector since the photo-charge carriers do not have to diffuse over a long distance before being collected.

According to another embodiment of the invention, the detector comprises a collector diode including:
  a semiconductor zone formed in the semiconductor absorption layer and of opposite electrical conductivity to that of the semiconductor absorption layer; and
  a metallization arranged in contact with the semiconductor layer for the collection of photo-charge carriers generated in the semiconductor absorption layer.

According to one alternative, the periodic grating, the mirror and the metallization are short-circuited.

According to another alternative, the periodic grating and the mirror are short-circuited and are electrically insulated from the metallization.

According to another alternative, the periodic grating, the mirror and the semiconductor absorption layer are short-circuited, and the periodic grating and the mirror are electrically insulated from the metallization.

According to another alternative, the mirror and the metallization are short-circuited and electrically insulated from the periodic grating. In particular, the periodic grating and the semiconductor absorption layer are short-circuited and electrically insulated from the metallization.

According to one alternative, the metallization passes without contact through the mirror and the periodic grating.

BRIEF DESCRIPTION OF THE DRAWINGS

The invention will be better understood from reading the following description, given solely by way of example, and provided in relation to the appended drawings, wherein identical reference numbers denote identical elements, and wherein.

DETAILED DESCRIPTION OF THE INVENTION

Figure 1:
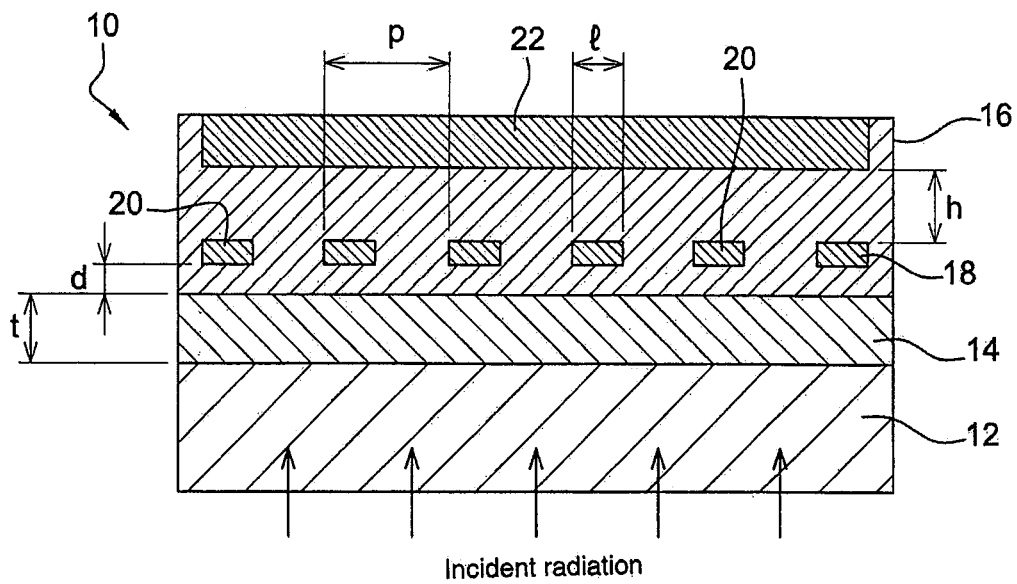
FIG. 1 is a diagrammatic cross-section view of a detector according to the invention including a mirror in the background.

With reference to FIG. 1, a backlit detector 10 according to the invention includes:

a medium 12 transparent, or partially transparent, to an incident radiation in a range of wavelengths for detection and of refractive index $n_{substrat}$. The medium 12 is in this example a substrate, of CdZnTe for example. As an alternative, the medium is an air layer, the layer 14 being for example suspended above a substrate;

a semiconductor absorption layer 14 formed on the substrate 12 to absorb the radiation and create electron hole pairs. This layer 14 is selected so as to absorb a particular wavelength $\lambda$ of the wavelength range under consideration, absorption being maximum for this wavelength $\lambda$, and has a refractive index n. For example, the layer 14 comprises a semiconductor material chosen from the group comprising CdHgTe, InGaAs and III-V ternary semiconductors including Sb, InSb, SiGe or Ge. For example, the layer 14 comprises HgCdTe whereof the Cd composition index allows absorption at the wavelength $\lambda$. The thickness t of the layer 14 is furthermore chosen so that it lets through some of the radiation for detection; and a layer 16 transparent, or partially transparent, to the radiation of interest, electrically insulating, and formed on the absorption layer 14 and of refractive index $n_2$.

The layer 16 comprises:

a periodic grating of one-dimensional patterns 18 placed at a distance d from the absorption layer 14. The periodic grating 18, of pitch p and of fill factor f, is for example constituted by parallel metal bars 20 of rectangular cross-section and of width l. The fill factor f of the grating 18 is in this example equal to $$f = \frac{l}{p}.$$

Since the thickness of the grating is independent of the resonance phenomena and the absorbed wavelength, it is selected to be thin, typically less than 100 nanometers. The geometry of the grating 18, and in particular its pitch p, serves to control the resonance wavelength; and a plane metal mirror 22, placed above the periodic grating 18 at a distance h therefrom.

Furthermore, the periodic grating 18 and the mirror 22 satisfy the following relations:

$$d \leq \frac{\lambda}{\mathrm{Re}(n_1)} \tag{1}$$

$$\frac{\lambda}{16 \times \mathrm{Re}(n_2)} + m \times \frac{\lambda}{2 \times \mathrm{Re}(n_2)} \leq h \leq \frac{3 \times \lambda}{8 \times \mathrm{Re}(n_2)} + m \times \frac{\lambda}{2 \times \mathrm{Re}(n_2)} \tag{2}$$

$$\frac{\lambda}{\mathrm{Re}(n_1)} \leq p \leq \frac{\lambda}{\max(\mathrm{Re}(n_2), \mathrm{Re}(n_{substrat}))} \tag{3}$$

$$\mathrm{Re}(n_2) \leq 1, 3 \times \mathrm{Re}(n_1) \tag{4}$$

$$\mathrm{Re}(n_1) \geq \mathrm{Re}(n_{substrat}) \tag{5}$$

where m is a positive or null integer,

As stated previously, such an arrangement serves to implement a resonant diffraction in the semiconductor absorption layer 14, the effect of which, in particular, is to substantially enhance the quantum efficiency of the detector 10.

Preferably, the distance d between the periodic grating and the semiconductor layer 14 verifies the relation $$d < \frac{\lambda}{4 \times \mathrm{Re}(n_1)}.$$

In this way, the localized electric field near the periodic grating 18 penetrates more deeply into the semiconductor layer 14, which further enhances the quantum efficiency.

Preferably, the thickness of the semiconductor layer 14 verifies the relation $$t \leq \frac{\lambda}{3 \times \mathrm{Im}(n_1)},$$

where Im denotes the imaginary component. This guarantees that the radiation is not totally absorbed by the semiconductor layer 14 when it first passes through and that it therefore sees the influence of the periodic grating 18.

Preferably, the distance h between the mirror 22 and the periodic grating 18 is substantially equal to $$\frac{\lambda}{4 \times \mathrm{Re}(n_2)}$$

or an odd multiple of this value. In this way, the constructive interference of the radiation in the semiconductor absorption layer 14 is promoted, which further enhances the quantum efficiency.

Preferably, the fill factor f of the periodic grating 18 is close to 50% to promote strong diffraction.

Preferably, the fill factor f verifies the relation $$\frac{1}{5} \leq f \leq \frac{3}{4},$$

which allows enhanced quantum efficiency for both TM polarization and TE polarization, even in the situation where the periodic grating 18 is one-dimensional.

Preferably, the periodic grating 18 and the metal mirror 22 are made of a metal with low optical loss, for example silver, gold, copper, aluminum, or an alloy thereof, which serves to minimize the energy absorbed by the metal constituting the grating 18 and the mirror 22. To advantage, the grating 18 and the mirror 22 also include a thin film of primer, such as for example Ti, which promotes the subsequent deposition of the metal of the periodic grating 18 and the mirror 22.

A description will now be given, in relation to FIGS. 2 and 3, of the performance of a detector according to the first embodiment for an absorption of radiation in the range of the middle infrared spectrum (3-5 μm).

In this embodiment, the substrate 12 is of CdZnTe and the semiconductor absorption layer 14 is of CdHgTe for an absorption in the middle infrared. The Cd composition index of the MCT of the layer 14 is equal to 0.3, so that the wavelength λ is between 3 and 5 μm and is worth 4 μm. The thickness of the semiconductor layer 14 is less than $$\frac{\lambda}{3 \times \mathrm{Im}(n_1)},$$

in this example a thickness of 300 nanometers.

The layer 16, in which the periodic grating 18 and the mirror 22 are produced, is constituted by ZnS and the periodic grating 18, made of Au, is placed at a distance d of 50 nanometers from the layer of MCT 14, i.e., at a distance d of about $$\frac{\lambda}{40 \times Re(n_1)}.$$

The mirror 22, also made of Au, is for its part placed at a distance h of 500 nanometers from the periodic grating 18, i.e., a distance h of about $$\frac{\lambda}{4 \times \mathrm{Re}(n_2)}.$$

Furthermore, the pitch of the periodic grating 18 is 1.45 μm, i.e. a value of about $1.25 \times \lambda / n_1$, and the width l of the metal bars 20 is equal to 500 nanometers, so that the fill factor f of the grating 18 is equal to 34%.

Lastly, in operation, the detector is cooled to a temperature of 77 K.

Figure 2:
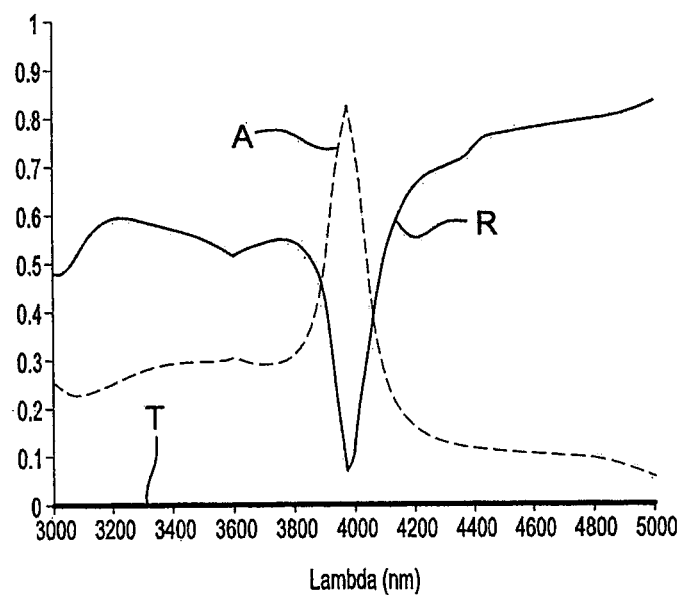
FIG. 2 is a graph of the absorption, transmission and reflection curves of one embodiment example of the detector in FIG. 1.

FIG. 2 shows the response of this detector in absorption (curve "A"), in reflection (curve "R"), and in transmission (curve "T") in a range of wavelengths 3-5 μm, presuming that any photo-generated charge carrier is collected. FIG. 3 shows the quantum efficiency in this same range for TM and TE polarizations.

As it is possible to note, the inventive detector has a maximum quantum efficiency of more than 80%, whatever the polarization of the incident radiation. 10% remaining are absorbed by the metal elements of the structure, and the last 10% are reflected.

It will be noted that by replacing the grating and the mirror by a simple plane metal mirror, as is the case in the prior art, the result would be only 30% quantum efficiency, whatever the distance from this mirror to the active layer 14.

A detector has been described fitted with a plane metal mirror 22. As an alternative, as has been shown in FIG. 4, the plane metal mirror 22 is replaced by a textured metal mirror 32 having for example a pattern complementary to that of the periodic grating 18. For example, a metal bar 20 faces a recess of same surface made in the mirror 32.

Figure 5:
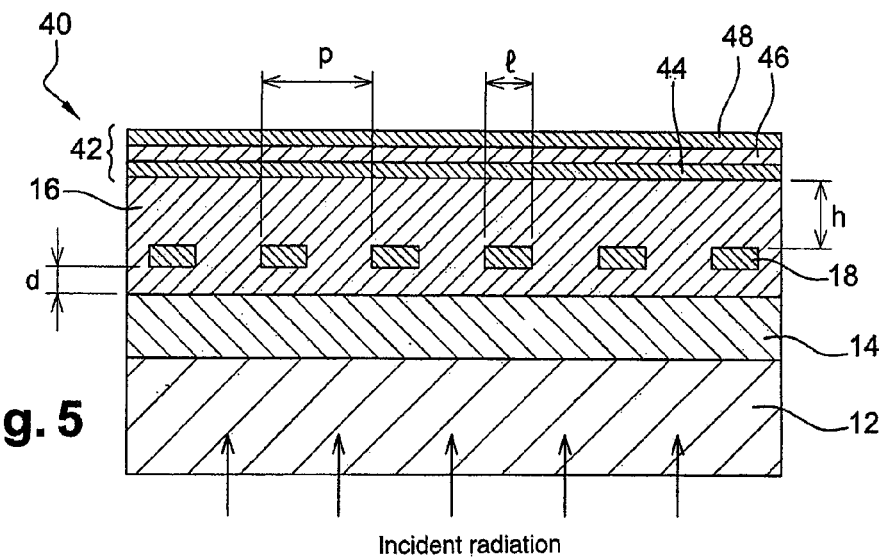
FIG. 5 is a diagrammatic cross-section view of an alternative embodiment of the detector in FIG. 1 with a rear mirror of the Bragg mirror type.

As an alternative, as is shown in FIG. 5, the plane metal mirror 22 is replaced by a Bragg mirror 42, for example formed of three bi-layers 44, 46, 48 each constituted by a layer of germanium of a thickness of $$\frac{\lambda}{4 \times \mathrm{Re}(n_{Ge})}$$

and a layer of ZnS of a thickness of $$\frac{\lambda}{4 \times \mathrm{Re}(n_{ZnS})},$$

where $n_{Ge}$ and $n_{ZnS}$ are the refractive indices of the germanium and the zinc sulfide respectively.

Figure 6:
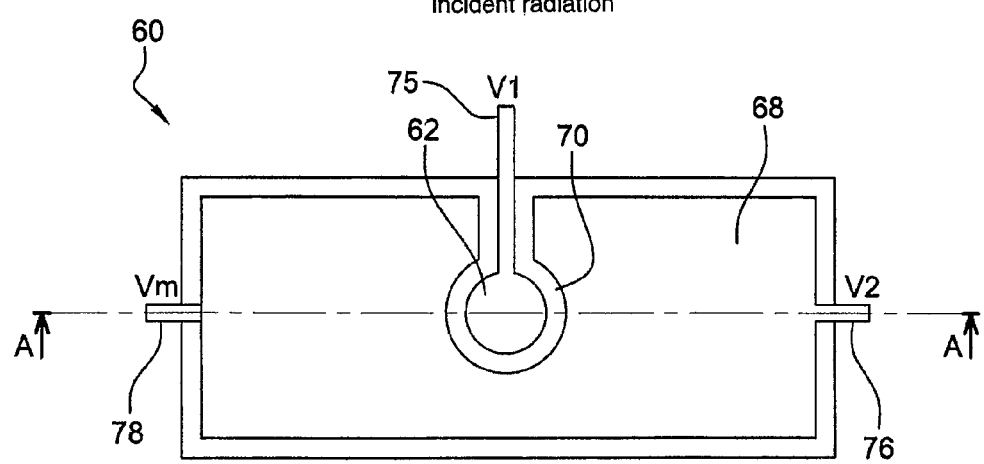
FIG. 6 is a diagrammatic view from above of an inventive detector including a collector diode.
Figure 7:
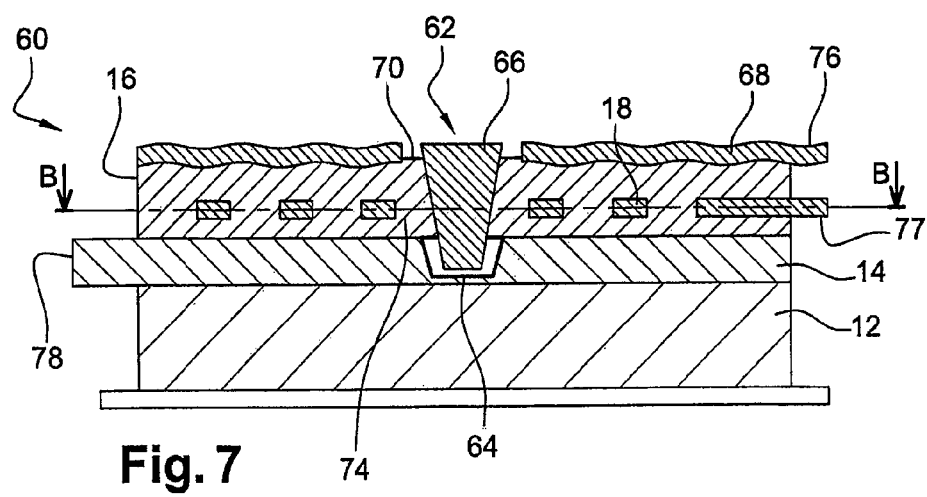
FIG. 7 is a diagrammatic cross-section view along the axis A-A of the detector in FIG. 6.
Figure 8:
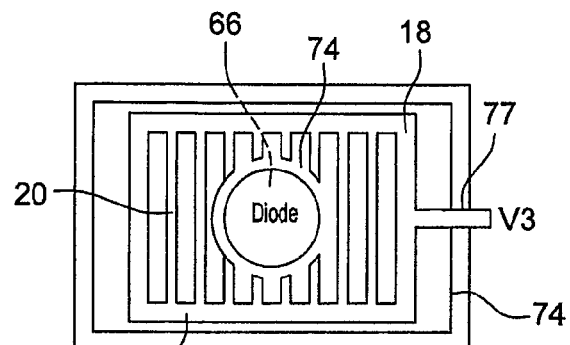
FIG. 8 is a diagrammatic cross-section view along the axis B-B of the detector in FIG. 7.

FIG. 6 is a diagrammatic view from above of a detector 60 according to the invention. FIGS. 7 and 8 are cross-section diagrammatic views respectively of this same detector along the axes A-A and B-B respectively. The detector 60 comprises a collector diode 62. The collector diode 62 comprises a semiconductor zone 64, n-doped for example, of opposite electrical conductivity to that of the absorption layer 14, p-doped for example, so as to form a PN junction, and a metallization 66, for example truncated cone shaped, forming a collector electrode, passing through the layer 16 and being in contact with the semiconductor zone 64 for the collection of photo-charge carriers.

The rear mirror 68 is preferably textured for the reasons stated above, and comes for example in the form of corrugations, and comprises an aperture 70 for the metallization 66, so as to prevent any short-circuit between the minor 68 and the metallization 66. Likewise, the periodic grating 18 comprises an aperture 74 for the metallization 66 in order to prevent any short-circuit there between.

To advantage, the metallization 66 is implemented in the same metal as the mirror 68, which means these two elements can be manufactured simultaneously.

Furthermore, the metallization 66, the mirror 68, the periodic grating 18 and the semiconductor layer 14 include contacts 75, 76, 77, 78 respectively so as to be able to be brought to different potentials, and in particular a first potential $V_1$ for the metallization 66, a second potential $V_2$ for the mirror 68, a third potential $V_3$ for the grating 18 and a fourth potential $V_m$, equal to the ground potential, for the semiconductor layer 14. As shown in FIG. 8, the patterns of the periodic grating 18 are electrically connected to each other so as to be brought to the same potential $V_3$. For example, if the patterns are parallel metal bars 20 as previously described, these are included in a metal frame 79 comprising the contact 77.

The photo-charge carriers are collected via the collector diode 62 as follows.

The potential difference applied between the contacts 75 and 78 induces a potential drop in the space charge zone formed by the contact between the semiconductor layer 14 and the semiconductor zone 64. The collector diode 62 therefore has a slight reverse voltage bias. The photo-charge carriers generated mostly under the periodic grating 18 which diffuse as far as this space charge zone are therefore collected by means of the metallization 66.

Additionally, two metal-insulator-semiconductor capacitors are formed by combining the metal mirror 68, the insulating layer 16, and the semiconductor layer 14, and by combining the metal grating 18, the insulating layer 16, and the semiconductor layer 14. Thus, the potential difference applied between the contacts 76 and 78, and the difference in potentials applied between the contacts 77 and 78, serve each, or in combination, to modulate by field effect the distribution of photo-charge carriers generated in the semiconductor layer 14, so as to reduce the noise and to increase the efficiency of the charge collection.

If for example a p-doped semiconductor layer 14 is considered, applying a potential difference different from the flat band voltage of the metal-insulator-semiconductor stack described above between the contacts 76 and 78 and/or the contacts 77 and 78 allows a localized depletion layer to be formed in the semiconductor layer 14 and directly under the interface between it and the layer 16. This depletion zone therefore masks this interface to the photo-charge carriers, thereby lessening the probability of electron hole recombination locally under this interface, in respect of electrical faults more numerous at this point than at the center of the semiconductor layer 14.

There is thus a plurality of preferred electric polarization configurations of the detector 60:

1) A configuration wherein the mirror 68, the grating 18 and the metallization 66 are short-circuited, i.e., electrically connected: the potential of these three elements $V_1=V_2=V_3$ serves to define the bias voltage $V_1-V_m$ of the collector diode 62 in accordance with the prior art operation of CdHgTe detectors in terms of photo-charge carrier collection;
2) A configuration wherein the mirror 68 and the grating 18 are short-circuited and electrically insulated from the metallization 66: the potential of the mirror 68 and the grating 18 $V_2=V_3$ acts as an electrostatic guard, with the advantage described above of the electrical masking effect of the upper interface of the semiconductor layer 14, the bias of the collector diode 62 being $V_1-V_m$;
3) A configuration wherein the mirror 68, the grating 18 and the semiconductor layer 14 are short-circuited for example to the ground and wherein the mirror 68 and the grating 18 are electrically insulated from the metallization 66: these three elements are brought to the same potential $V_2=V_3=V_m$ and the collector diode 62 has a voltage bias $V_1-V_m$, in accordance with the prior art operation of CdHgTe detectors in terms of electrical collection. The advantage of such a configuration is the limitation of the parasitic capacitance generated by the close proximity between the semiconductor layer and the metal parts 18, 68.

Figure 9:
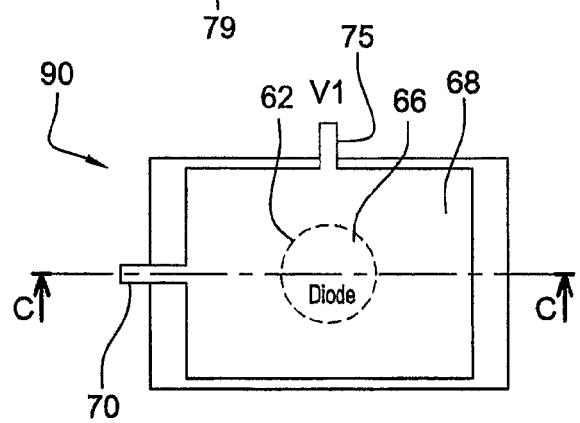
FIG. 9 is a diagrammatic view from above of a detector according to one alternative of the invention.
Figure 10:
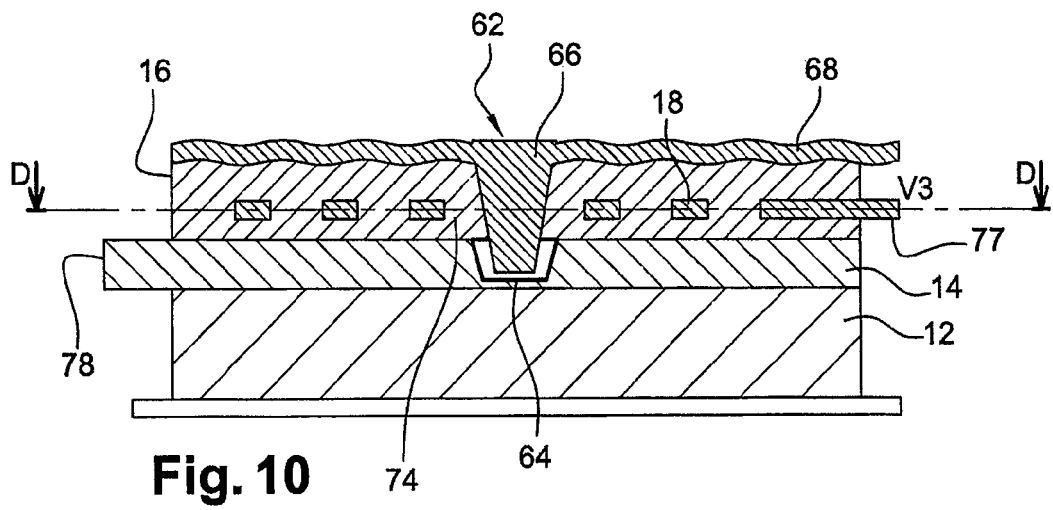
FIG. 10 is a diagrammatic cross-section view along the axis C-C of the detector in FIG. 9.
Figure 11:
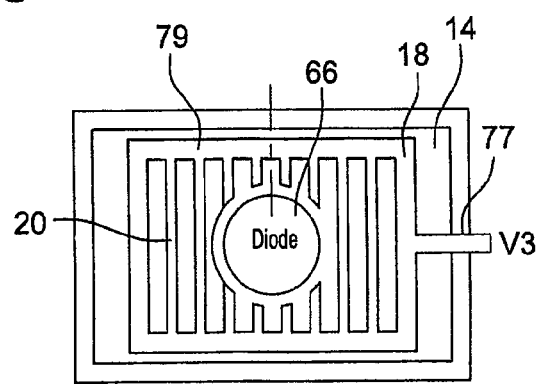
FIG. 11 is a diagrammatic cross-section view along the axis D-D of the detector in FIG. 9.

FIG. 9 is a diagrammatic view from above of a detector 90 according to one inventive alternative. FIGS. 10 and 11 are cross-section diagrammatic views respectively of this same detector along the axes C-C and D-D respectively.

The detector 90 differs from the detector 60 as previously described in that the metallization 66 and the mirror 68 form only one single component, the aperture 70 being absent. The metallization 66 and the mirror 68 are thus brought to the same potential $V_1$ by means of the contact 75, the contact 76 being omitted.

The leak of non-absorbed photons through the semiconductor layer 14 is thus avoided, which serves to enhance the quantum efficiency of absorption. Indeed, in the detector 60 previously described, the gap between the metallization 66 and the mirror 68 must be greater than or equal to the lateral resolution of the technological process used to make the detector, for example by the lithography method. This gap may be not insignificant, for example 1 micron, for low-cost UV lithography technologies. This configuration of the detector 90 has the additional advantage of being more straightforward to implement given the absence of the aperture 70. The advantage of the configuration of the detector 60 allowing the application of a different potential at the contact 76 relative to the contact 75, made possible by the aperture 70, is that the potential applied by the contact 76 is more homogeneous spatially than the potential applied by the grating via the contact 77, unlike the configuration of the detector 90.

The photo-charge carriers are collected via the collector diode 62 in the detector 90 similarly to the manner described in relation to the detector 60 except for the sole fact that it is not possible to apply an independent gate voltage via the mirror 68, the distribution of the photogenerated charges being determined solely by the potential applied to the grating 18. Similarly to the detector 60, the following configurations can be applied to the detector 90:

1) A configuration wherein the grating 18 and the metallization 66 (and therefore the mirror 68) are short-circuited: the potential of these three elements $V_1=V_2=V_3$ serves to define the bias voltage $V_1-V_m$ of the collector diode 62 in accordance with the prior art operation of CdHgTe detectors in terms of the collection of the photo-charge carriers;
2) A configuration wherein the grating 18 and the metallization 66 are insulated: the potential $V_3$ of the grating 18 acts as an electrostatic guard, with the advantage described above of the electric masking effect of the upper interface of the semiconductor layer 14, the bias of the collector diode 62 being $V_1$-$V_m$;

3) A configuration wherein the grating 18 and the semiconductor layer 14 are short-circuited for example to the ground and wherein the grating 18 is insulated electrically from the metallization 66: these two elements are brought to the same potential $V_3$=$V_m$, the collector diode 62 is biased by $V_1$-$V_m$, in accordance with the prior art operation of CdHgTe detectors in terms of electrical collection. The advantage of such a configuration is the limitation of the parasitic capacitance generated by the close proximity between the semiconductor layer 14 and the metal parts 18, 68. This limitation of the capacitance will be less than for the same configuration of the detector 60, since a parasitic capacitance will subsist between the grating 18 and the mirror 68. However, given the dimensioning of the structure, the thickness between the grating 18 and the mirror 68 being about ten times greater than the thickness between the grating 18 and the semiconductor layer 14, this capacitance will be less than that of configuration 1) above.

An embodiment has been described in which a collector diode is provided to collect the photo-charge carriers generated in the semiconductor layer 14.

In an alternative in which the collector diode 62 is not provided, or in a manner complementary to the collector diode 62, the periodic grating 18 is used as a collector electrode by forming it in contact with the semiconductor absorption layer 14 (d=0). The advantage of this configuration is the increased speed of the detector since the photo-charge carriers do not have to diffuse over a long distance before being collected. Indeed, any point on the semiconductor absorption layer 14 is close to one of the metallic patterns of the grating 18, thereby minimizing the distance between the place where photo-charge carriers are generated and the place where they are collected.

Detectors have been described wherein the periodic grating is one-dimensional. Such a grating enhances quantum efficiency whatever the polarization of the incident radiation. However, as shown in FIG. 3, the spectral response is not rigorously identical for each of the polarizations. To facilitate making the detector insensitive to the polarization, or to obtain an independent control over the response of each of the polarizations, the periodic grating is to advantage two-dimensional, and therefore has a periodicity in two orthogonal directions. For example, the periodic grating 18 is replaced by a square mesh grating in the form of square or circular metal pads formed in the layer 16 or a thin metal membrane arranged in the layer 16 and drilled with square or circular apertures in a square mesh.

In this case of a bi-periodic grating of metal pads, the potential of the pads is floating. Thanks to the potential configuration described in FIGS. 6, 7 and 8, it is possible to independently control the potential difference used for the collection through the collector diode 62 and the potential difference used to modify the distribution of photogenerated charges in the semiconductor layer 14.

In the contrary case of a bi-periodic grating of metal apertures, there is electrical continuity of the metal grating 18 and the procedures described in FIGS. 6 to 11 may be applied.

The dimensions and distances associated with these two-dimensional periodic gratings are the same as those of the grating 18 of a network of lines except for the width of the structuring. For the latter, we then have $$\frac{p}{4} \le l \le p,$$

the width l being in this case the width of the pads in the case of a grating of square thin pads, or the width of the metal space between two holes in the case of a grating of holes in a thin metal membrane.

Figure 4:
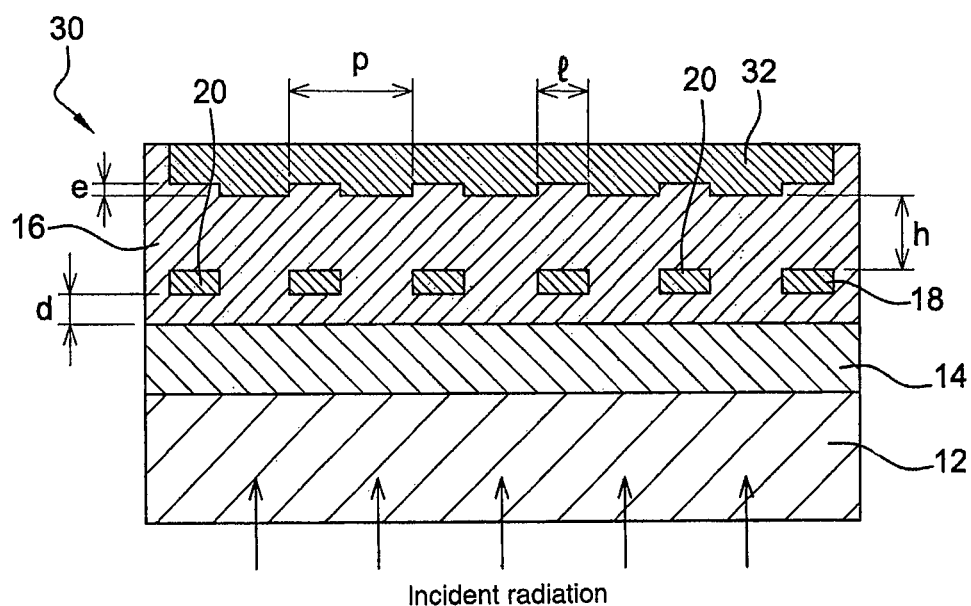
FIG. 4 is a diagrammatic cross-section view of an alternative embodiment of the detector in FIG. 1 with a textured rear mirror.

A method for the manufacture of an inventive detector, for example the one in FIG. 4, is now described in relation to FIGS. 12A to 12G.

Figure 12A:
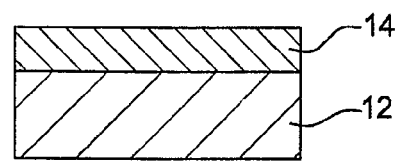
FIGS. 12A to 12G are diagrammatic cross-section views showing a method for producing a detector according to the invention.

The manufacturing method begins with the growth on a substrate 12, of CdZnTe for example, of a semiconductor layer 14 absorbing the incident radiation of interest, such as for example a layer of MCT 300 nanometers thick (FIG. 12A).

Figure 12B:
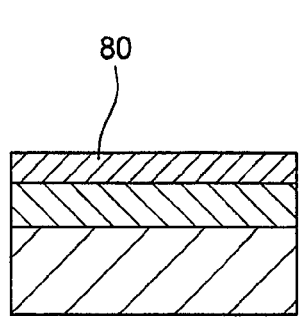
Figure 12C:
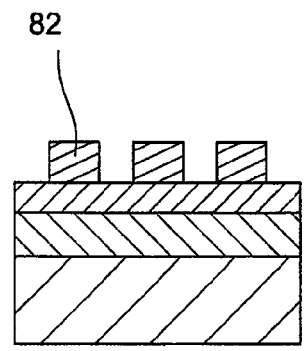

The method then continues with the deposition of a protective layer 80, of ZnS for example, 50 nanometers thick (FIG. 12B). An electronic or optical resin layer is then deposited on the protective layer 80, then electronic or UV lithography is performed to insulate patterns 82 with a thickness of a few hundred nanometers, for example 500 nanometers (FIG. 12C).

Figure 12D:
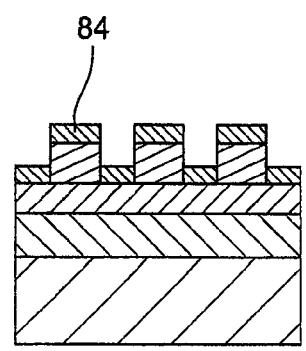

After the resin is developed, a step of "lift-off" of the metal 84, for example Au, is implemented to form the periodic grating (FIG. 12D). Additionally, the thickness of the metal 84 is chosen to be thin, for example 50 nanometers, which greatly promotes the success of this "lift-off" step. This means in particular that the formation of faults of the "cap" type is prevented.

Figure 12E:
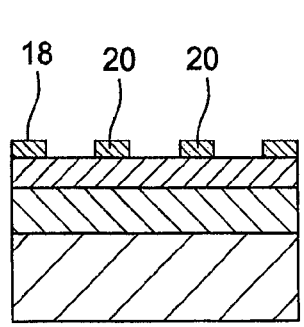
Figure 12F:
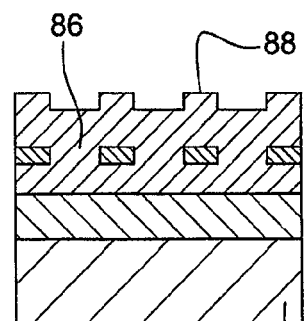

The metal 84 coating the patterns 82 is then removed at the same time as the remaining resin 82, for example by a solvent such as acetone, so as to leave only the periodic grating 18 (FIG. 12E).

The method then continues with the encapsulation of the periodic grating 18 using a material 86 with a refractive index lower than that of the semiconductor absorption layer 14, over the thickness h so as to respect the appropriate spacing between the grating and the mirror.

This material may for example be ZnS with a thickness of 500 nanometers. However, other materials may be used. Patterns 88 are thus formed above the patterns 20 of the periodic grating 18 (FIG. 12F), by cathode sputtering for example.

Figure 12G:
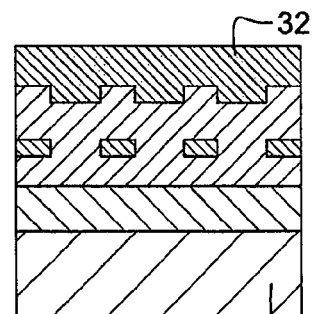

The deposition of the mirror 32, by depositing a layer of Ti primer 10 nm thick for example, followed by a layer of Au with a thickness of 150 nm, with the gold being sufficiently thick to prevent any light transmission through this last layer (FIG. 12G).

This mirror 32 is thus structured with the same period as the periodic grating 18, the form of the repeated pattern depending on the nature of the layers and on the methods of depositing them over the periodic grating 18. In particular, the textured pattern thickness e of the mirror 32 is less than or equal to the thickness of the periodic grating 18, and between 0 and $$\frac{\lambda}{10 \times \mathrm{Re}(n_2)},$$

i.e., for example of about 100 nm for a periodic grating 18 100 nm thick.

Figure 3:
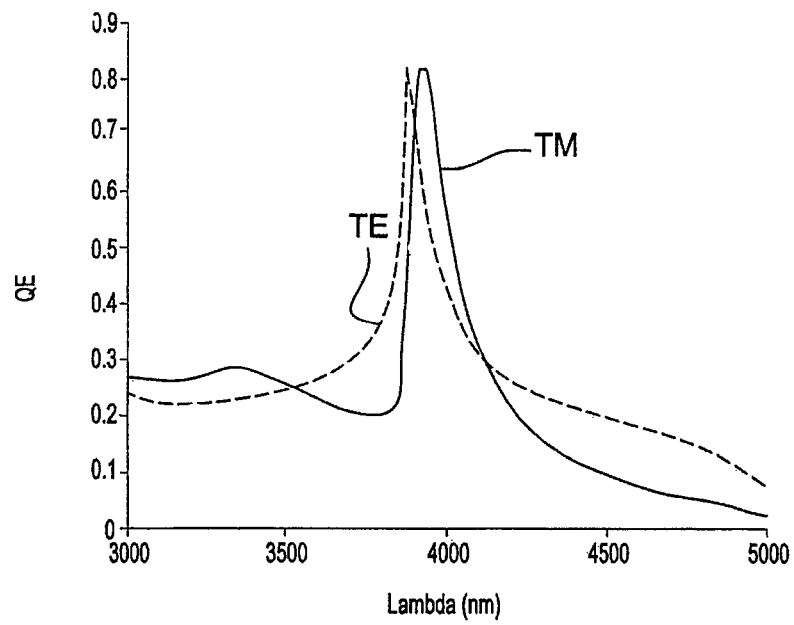
FIG. 3 is a graph of the quantum efficiency of the embodiment example of the detector for the TM polarization and the TE polarization.

An embodiment has been described in relation to FIGS. 2 and 3 that prioritizes high quantum efficiency. For some applications, the width of the absorption peak may be considered as insufficient.

As an embodiment alternative, it is possible to increase the width of this peak reducing the distance d between the semiconductor layer 14 and the grating 18.

Figure 13:
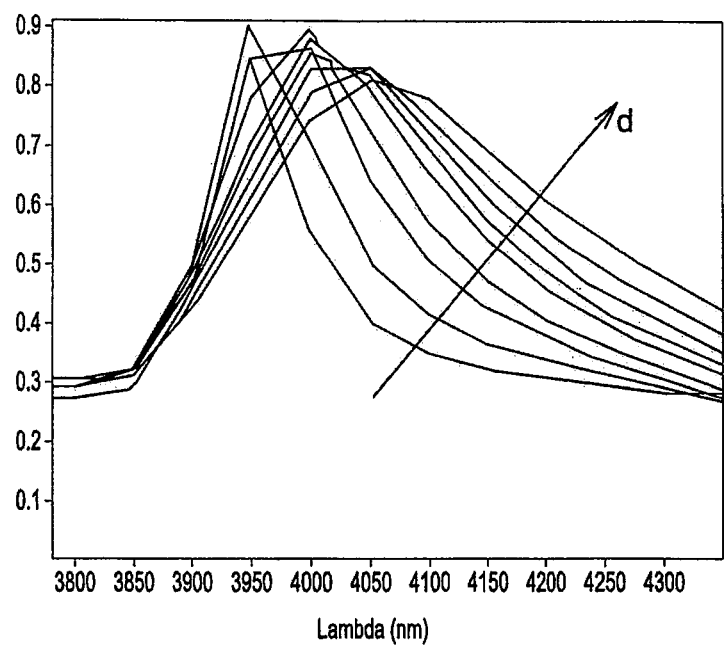
FIG. 13 is a graph showing the absorption response of an inventive detector as a function of various values of the distance between the periodic grating of periodic patterns and the semiconductor absorption layer.

FIG. 13 shows the absorption response as a function of various values of distance d for an MCT semiconductor layer 14 with a thickness of 400 nm, a one-dimensional periodic grating 18 with a pitch p of 1.45 µm, a width l of 500 mn, a thickness of 50 nm and separated from the mirror 22 by a distance h of 500 nm.

In this embodiment example, the distance d varies from 10 nm (widest peak) to 300 nm (narrowest peak). As may be noted, as d increases the width of the absorption peak increases.

As an alternative, or in a complementary manner, it is also possible to control the width of the absorption peak by varying the thickness t of the semiconductor layer 14, but at the cost of a rise in background intensity, i.e., the absorption level outside the resonance peak.

Figure 14:
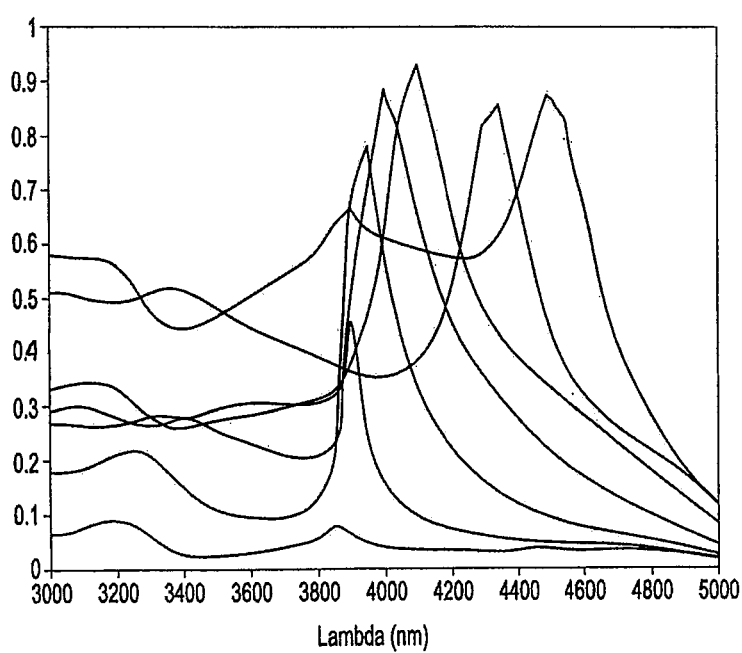
FIG. 14 is a graph showing the absorption response of an inventive detector as a function of various values of the thickness of the semiconductor absorption layer.

FIG. 14 shows the absorption response as a function of various values of thickness t of the semiconductor layer 14, for a one-dimensional periodic grating 18 with a pitch p of 1.45 µm, a width l of 500 nm, a thickness of 50 nm, separated from the mirror 22 by a distance h of 500 nm and separated from the layer 14 by a distance d of 50 nm.

In this embodiment example, the thickness t of the layer 14 is of 100 nm (left-hand peak, very low) to 1000 nm (right-hand peak).

In the two cases shown in FIGS. 8 and 9, good resonance efficiency is retained, namely absorption greater than 60%.

The invention claimed is:

1. A backlit detector for the detection of electromagnetic radiation around a predetermined wavelength, including:
   a semiconductor absorption layer for the absorption of said radiation, formed above a medium at least partially transparent to said radiation, and having a thickness capable of transmitting at least some of said radiation; and
   a mirror placed above the semiconductor layer to reflect radiation received therethrough,
   wherein it comprises, placed between the mirror and the semiconductor layer, a periodic grating of metallic patterns, the mirror and the periodic grating being included in a layer of material at least partially transparent to said radiation and formed on the semiconductor layer,
   and wherein the mirror and the periodic grating of metallic patterns are designed to verify the following relations:

$$d \le \frac{\lambda}{\text{Re}(n_1)}$$

$$\frac{\lambda}{16 \times \text{Re}(n_2)} + m \times \frac{\lambda}{2 \times \text{Re}(n_2)} \le h \le \frac{3 \times \lambda}{8 \times \text{Re}(n_2)} + m \times \frac{\lambda}{2 \times \text{Re}(n_2)}$$

$$\text{Re}(n_2) \le 1, 3 \times \text{Re}(n_1)$$

$$\text{Re}(n_1) \ge \text{Re}(n_{substrat})$$

where
Re denotes the real component;
d is the distance between the semiconductor layer and the periodic grating,
h is the distance between the mirror and the periodic grating,
m is a positive or null integer,
λ is a wavelength at which the semiconductor layer is absorbent,
$n_1$ is the refractive index of the semiconductor layer,
$n_2$ is the refractive index of the layer in which the periodic grating and the mirror are formed; and
$n_{substrat}$ is the refractive index of the medium above which the semiconductor absorption layer is formed.

2. The backlit detector for the detection of electromagnetic radiation as claimed in claim 1, wherein the grating of patterns of metallic patterns is designed to verify the following relation:

$$\frac{\lambda}{\text{Re}(n_1)} \le p \le \frac{\lambda}{\max(\text{Re}(n_2), \text{Re}(n_{substrat}))}$$

where p is the pitch of the grating.

3. The backlit detector for the detection of electromagnetic radiation as claimed in claim 1, wherein the semiconductor layer has a thickness of less than 500 nanometers, and preferably more than 50 nanometers.

4. The backlit detector for the detection of electromagnetic radiation as claimed in claim 1, wherein the thickness of the semiconductor layer verifies the relation $$t \le \frac{\lambda}{3 \times \text{Im}(n_1)},$$

where t is the thickness of the semiconductor layer and Im denotes the imaginary component.

5. The backlit detector for the detection of electromagnetic radiation as claimed in claim 1, wherein the distance between the mirror and the periodic grating is substantially equal to $$\frac{\lambda}{4 \times \text{Re}(n_2)}$$

or an odd multiple of this value.

6. The backlit detector for the detection of electromagnetic radiation as claimed in claim 1, wherein the periodic grating is one-dimensional, and is in particular constituted by metal bars.

7. The backlit detector for the detection of electromagnetic radiation as claimed in claim 6, wherein the fill factor f of the periodic grating verifies the relation $$\frac{1}{5} \le f \le \frac{3}{4}.$$

8. The backlit detector for the detection of electromagnetic radiation as claimed in claim 1, wherein the grating is two-dimensional, and is in particular constituted by holes or pads.

9. The backlit detector for the detection of electromagnetic radiation as claimed in claim 1, wherein the mirror is metal, and one surface of the mirror opposite the periodic grating is textured.

10. The backlit detector for the detection of electromagnetic radiation as claimed in claim 9, wherein the mirror is textured over a thickness e verifying the relation $$e \le \frac{\lambda}{10 \times \mathrm{Re}(n_2)}.$$

11. The backlit detector for the detection of electromagnetic radiation as claimed in claim 1, wherein the periodic grating and/or the mirror are made from a metal with low optical loss, and in particular silver, gold, copper or aluminum.

12. The backlit detector for the detection of electromagnetic radiation as claimed in claim 1, wherein the mirror is a Bragg mirror.

13. The backlit detector for the detection of electromagnetic radiation as claimed in claim 12, wherein the Bragg mirror includes at least one quarter wave bi-layer, comprising in particular a layer of germanium with a thickness of $$\frac{\lambda}{4 \times \mathrm{Re}(n_{Ge})}$$

and a layer of zinc sulfide with a thickness of $$\frac{\lambda}{4 \times \mathrm{Re}(n_{ZnS})},$$

where $n_{Ge}$ and $n_{ZnS}$ are the refractive indices of the germanium and the zinc sulfide respectively.

14. The backlit detector for the detection of electromagnetic radiation as claimed in claim 1, wherein the radiation for detection is an infrared radiation, and the thickness of the periodic grating is less than or equal to 100 nm.

15. The backlit detector for the detection of electromagnetic radiation as claimed in claim 1, wherein the semiconductor absorption layer comprises a semiconductor material chosen from the group comprising CdHgTe, InGaAs and III-V ternary semiconductors including Sb, InSb, SiGe or Ge.

16. The backlit detector for the detection of electromagnetic radiation as claimed in claim 1, wherein the distance d between the semiconductor layer and the periodic grating is nil, and the periodic grating constitutes an electrode for collecting the photo-charge carriers generated in the semiconductor layer.

17. The backlit detector for the detection of electromagnetic radiation as claimed in claim 1, wherein it comprises a collector diode including:
- a semiconductor zone formed in the semiconductor absorption layer and of electrical conductivity opposite that of the semiconductor absorption layer; and
- a metallization arranged in contact with the semiconductor zone for collecting the photo-charge carriers generated in the semiconductor absorption layer.

18. The backlit detector for the detection of electromagnetic radiation as claimed in claim 17, wherein the periodic grating, the mirror and the metallization are short-circuited.

19. The backlit detector for the detection of electromagnetic radiation as claimed in claim 17, wherein the periodic grating and the mirror are short-circuited and are electrically insulated from the metallization.

20. The backlit detector for the detection of electromagnetic radiation as claimed in claim 17, wherein the periodic grating, the mirror and the semiconductor absorption layer are short-circuited, and the periodic grating and the mirror are electrically insulated from the metallization.

21. The backlit detector for the detection of electromagnetic radiation as claimed in claim 17, wherein the mirror and the metallization are short-circuited and electrically insulated from the periodic grating.

22. The backlit detector for the detection of electromagnetic radiation as claimed in claim 21, wherein the periodic grating and the semiconductor absorption layer are short-circuited and electrically insulated from the metallization.

23. The backlit detector for the detection of electromagnetic radiation as claimed in claim 17, wherein the metallization passes without contact through the mirror and the periodic grating.

* * * * *